US012575039B2

(12) United States Patent
Yoder et al.

(10) Patent No.: US 12,575,039 B2
(45) Date of Patent: Mar. 10, 2026

(54) SEALED ECU ASSEMBLY

(71) Applicant: VEONEER US SAFETY SYSTEMS, LLC

(72) Inventors: Jacob Jay Yoder, Dundee, MI (US); Luis Fernando Sanchez, Commerce Township, MI (US)

(73) Assignee: Veoneer US Safety Systems, LLC, Southfield, MI (US)

( * ) Notice: Subject to any disclaimer, the term of this patent is extended or adjusted under 35 U.S.C. 154(b) by 12 days.

(21) Appl. No.: 18/123,094

(22) Filed: Mar. 17, 2023

(65) Prior Publication Data
US 2024/0314945 A1 Sep. 19, 2024

(51) Int. Cl.
*H05K 5/00* (2025.01)
(52) U.S. Cl.
CPC ......... *H05K 5/0069* (2013.01); *H05K 5/0056* (2013.01); *H05K 5/0073* (2013.01)
(58) Field of Classification Search
CPC ........................... H05K 5/0069; H05K 5/0056
See application file for complete search history.

(56) References Cited

U.S. PATENT DOCUMENTS 6,707,678 B2 * 3/2004 Kobayashi ............. H05K 5/062
361/752
2009/0068862 A1 * 3/2009 Honda ................. H05K 5/0069
439/78

2017/0257964 A1 * 9/2017 Ishikawa .............. H05K 5/0047
2022/0225516 A1 * 7/2022 Saito ................... B60R 16/0239

* cited by examiner

*Primary Examiner* — Allen L Parker
*Assistant Examiner* — Peter Krim
(74) *Attorney, Agent, or Firm* — Dority & Manning, P.A.

(57) ABSTRACT

An apparatus includes a upper housing and a connector and printed circuit board assembly. The upper housing comprises three sides extending perpendicularly from a fourth side, where the four sides of the housing define a rectilinear volume and a connector opening, and the connector opening comprises one or more first ramp features configured to hold a sealant. The connector and printed circuit board subassembly comprises a connector assembly holding a plurality of terminal pins and attached to a printed circuit board substrate. The connector assembly extends perpendicularly from the printed circuit board substrate. Each of the plurality of terminal pins comprises a right angle bend. A first end of each of the plurality of terminal pins is inserted into the printed circuit board substrate. A second end of each of the plurality of terminal pins extend through the connector assembly. The connector assembly comprises one or more second ramp features configured to mate with the one or more first ramp features of the upper housing. The upper housing is configured to (i) allow assembling of the connector and printed circuit board subassembly into the upper housing using a vertical motion and (ii) interlock with the connector assembly to hold the printed circuit board substrate with the connector assembly and the plurality terminal pins in place within the housing.

17 Claims, 12 Drawing Sheets

VIEW OF A

VIEW OF B

<u>FIG. 13</u>

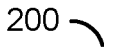
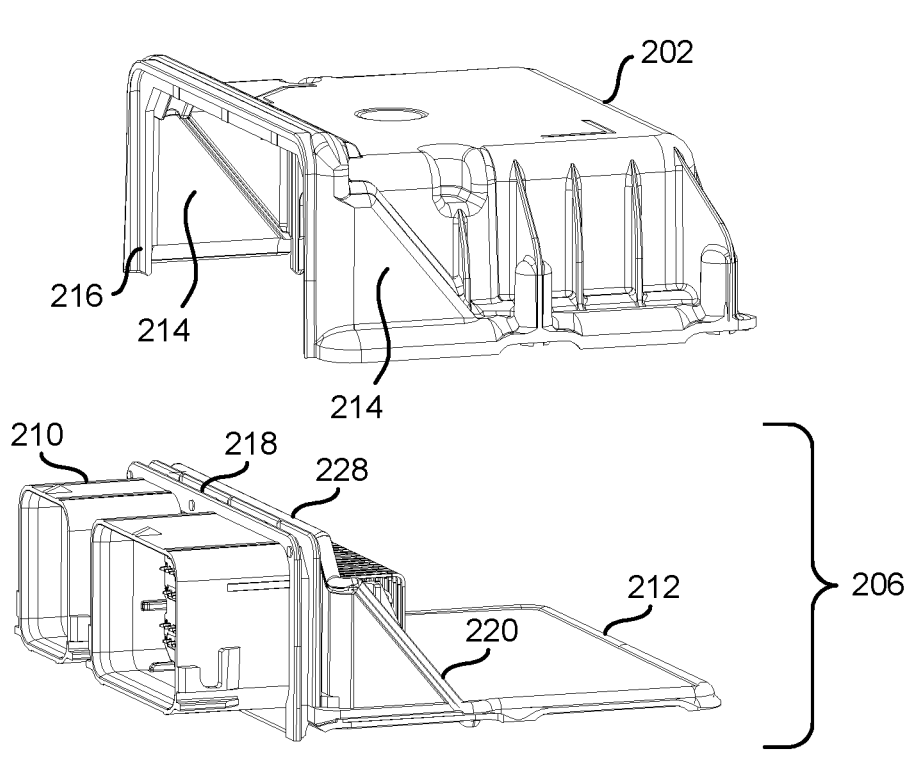
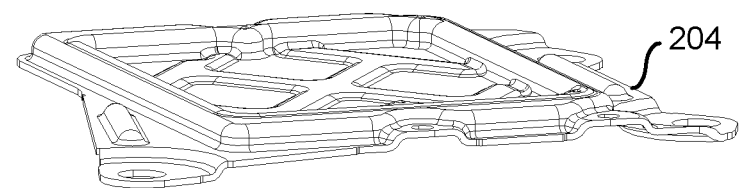
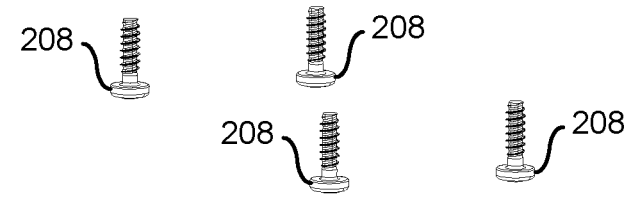
FIG. 14

VIEW OF C

VIEW OF D

SEALED ECU ASSEMBLY

FIELD OF THE INVENTION

The invention relates to automotive control assemblies generally and, more particularly, to a method and/or apparatus for implementing a sealed electronic control unit (ECU) assembly.

BACKGROUND

Manufactures commonly specify sealing levels for fully assembled electronic modules. The automotive industry requires a restraint control module be sealed to the environment in some applications. International Electrotechnical Commission (IEC) standard 60529, Degrees of Protection Provided by Enclosures (IP Codes), Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of one meter for thirty minutes (e.g., IP 67/68). In some applications customers require sealing to pressures up to 6 psi (e.g., IP 68). In some cases the pressure differential is created due to a customer requirement to preheat the module to 85° C. prior to conducting the water spray or immersion testing.

One or more connectors are conventionally included on the electronic modules to make electrical contact between printed circuit boards within the modules and vehicle harnesses outside the modules. Possible leak paths between the connectors and electronic module housings are commonly sealed with dispensed sealants or gaskets. Current electronic module designs have connector-housing interfaces that can result in excessive smearing of the dispensed sealant during assembly, which can lead to failure of the seal. Some electronic module designs require a separate curing process or separate component to compress the sealant, or require reorientation of the part during the assembly process and have other shortcomings.

It would be desirable to implement a sealed electronic control unit (ECU) assembly that avoids the above shortcomings.

SUMMARY

The invention concerns an apparatus includes an upper housing and a connector and printed circuit board assembly. The upper housing comprises three sides extending perpendicularly from a fourth side, where the four sides of the housing define a rectilinear volume and a connector opening, and the connector opening comprises one or more first ramp features configured to hold a sealant. The connector and printed circuit board subassembly comprises a connector assembly holding a plurality of terminal pins and attached to a printed circuit board substrate. The connector assembly extends perpendicularly from the printed circuit board substrate. Each terminal pin of the plurality of terminal pins comprises a right angle bend. A first end of each of the plurality of terminal pins is inserted into the printed circuit board substrate. A second end of each terminal pin of the plurality of terminal pins extends through the connector assembly. The connector assembly comprises one or more second ramp features configured to mate with the one or more first ramp features of the upper housing. The upper housing is configured to (i) allow assembling of the connector and printed circuit board subassembly into the upper housing using a vertical motion and (ii) interlock with the connector assembly to hold the printed circuit board substrate with the connector assembly and the plurality terminal pins in place within the housing.

BRIEF DESCRIPTION OF THE FIGURES

Embodiments of the invention will be apparent from the following detailed description and the appended claims and drawings.

FIG. 14 is a diagram illustrating an exploded view of the sealed electronic control module housing of FIG. 13.

DETAILED DESCRIPTION OF THE EMBODIMENTS

Embodiments of the present invention include providing a sealed electronic control unit (ECU) assembly that may (i)

provide a solution to fabricate a sealed control module with a right angle connector, (ii) be cost-effective to manufacture, (iii) utilize a sealant to seal an interface between a connector, a housing, and a cover, (iv) provide a channel on the housing around a perimeter of an opening for the connector into which the sealant may be dispensed, (v) comprise one or more angled ramp features on the connector and the housing that line up when assembled, (vi) avoid excessive smearing of the sealant during assembly, (vii) avoid a separate curing process or separate component to compress the sealant, and/or (viii) allow assembly without reorienting the part during assembly.

Figure 1:
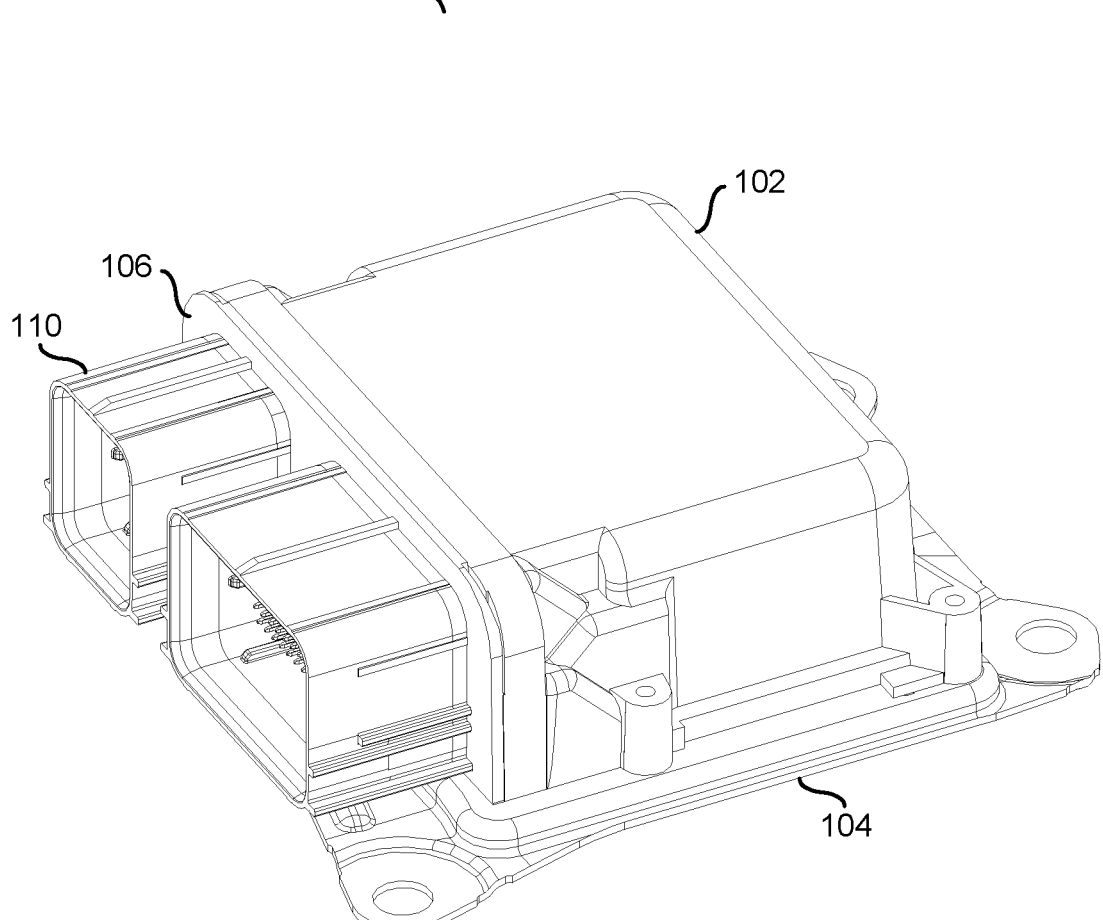
FIG. 1 is a diagram illustrating a perspective view of a sealed electronic control module housing in accordance with an example embodiment of the invention.

Referring to FIG. 1, a diagram is shown illustrating a perspective view of an apparatus 100 in accordance with an example embodiment of the invention. In various embodiments, the apparatus 100 may implement a sealed electronic control unit (or module) housing. The apparatus 100 generally comprises an upper housing 102, a lower housing (or cover or baseplate) 104, and a subassembly 106.

In an example, the upper housing 102 may be implemented as a nonconductive enclosure. While mated with the lower housing 104 and the subassembly 106, the upper housing 102 may be configured to provide an environmentally sealed enclosure. The enclosure may protect components and devices of the subassembly 106. In various embodiments, the upper housing 102 generally comprises a plastic or resin-based material. In various embodiments, the plastic or resin-based material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. Other materials may be implemented to meet the design criteria of a particular application.

In various embodiments, the lower housing 104 may be implemented using a metal or metal-alloy material, or a plastic or resin-based material similar to the upper housing 102. In an example, the lower housing 104 may be implemented as an electrically conductive baseplate. The lower housing 104 is generally configured to provide mechanical support, thermal cooling, and/or electrical grounding for the apparatus 100. In various embodiments, the lower housing 104 may comprise a die-cast Aluminum baseplate. In another example, the lower housing 104 may be implemented as a stamped steel baseplate. Implementing the lower housing 104 with a metallic material may aid in dissipating heat generated by circuitry within the apparatus 100. The lower housing 104 is generally configured to provide a mounting footprint for the apparatus 100. In an example, the lower housing 104 may be implemented with a mounting footprint that simplifies testing. Other footprints may be implemented to meet the design criteria of a particular application.

The subassembly (or electrical assembly) 106 may implement an electronic component of the apparatus 100. The subassembly 106 may be operational to perform one or more electrical functions. The electrical functions may include, but are not limited to, providing grounding paths for all electrical components inside the apparatus 100 to the exterior of the apparatus 100, transferring electrical inputs from different circuits in the vehicle to electronic components mounted inside the apparatus 100, monitoring the performance of electronic sensors in the vehicle and/or transmitting acceleration changes in the vehicle to the electronic components mounted in the apparatus 100. In various embodiments, the subassembly 106 generally comprises a connector assembly having one or more integrated connectors attached to one or more printed circuit boards. The connector assembly is generally configured to form a fifth side of the upper housing 102. The connector assembly of the subassembly 106 is generally secured to the upper housing 102 by a sealing feature that interlocks with a corresponding sealing feature of the upper housing 102. The one or more printed circuit boards may contain electrical circuitry configured to perform the electrical functions of an electronic control unit (ECU).

Figure 2:
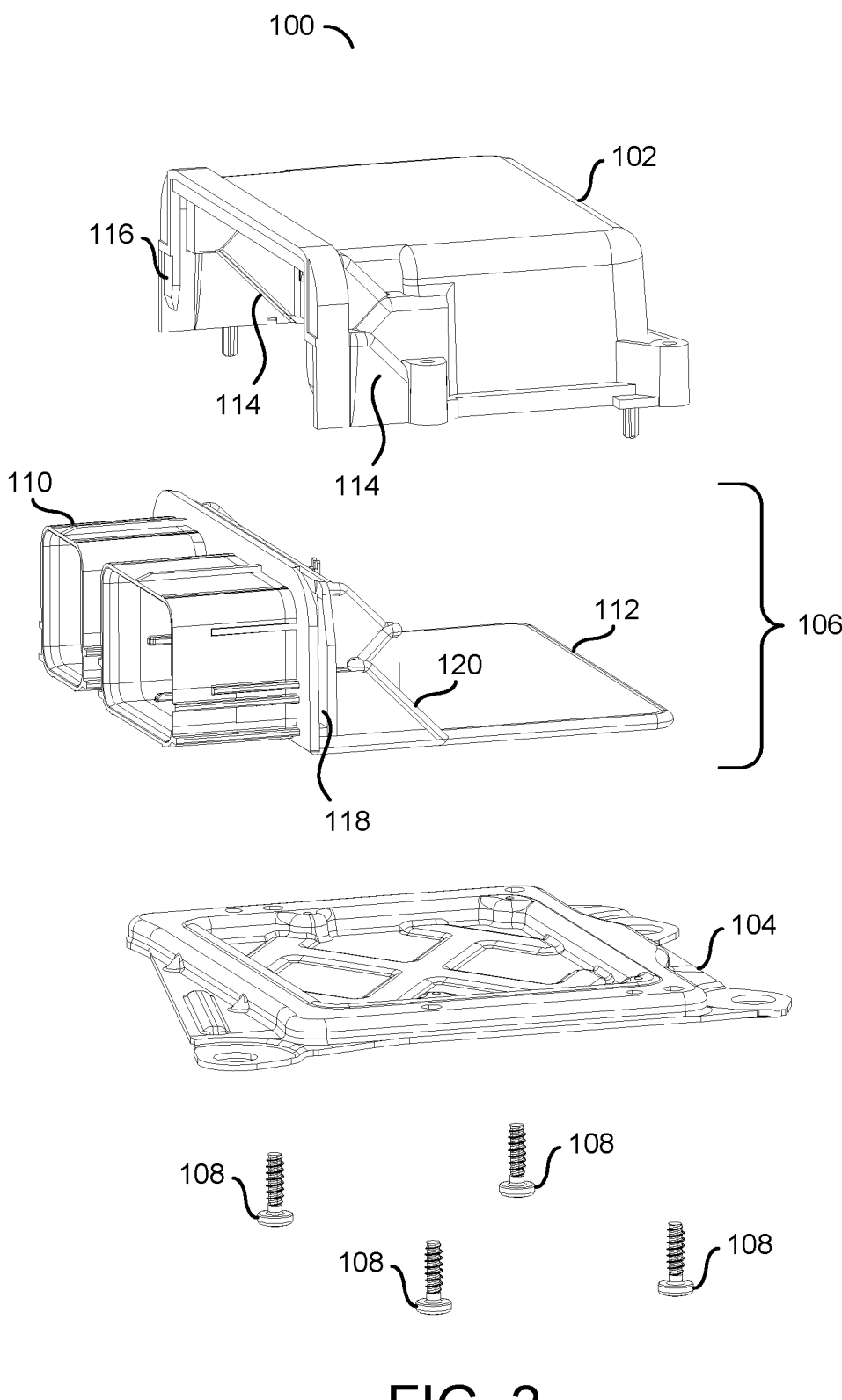
FIG. 2 is a diagram illustrating an exploded view of the sealed electronic control module housing of FIG. 1.

Referring to FIG. 2, a diagram is shown illustrating an exploded view of an electronic control unit (or module) implemented with the sealed electronic control module housing 100 of FIG. 1. In an example, assembly of the sealed electronic control module housing 100 may comprise assembling the subassembly 106 into the upper housing 102 and assembling the lower housing 104 to the upper housing 102. In an example, the lower housing 104 may be assembled (fastened) to the upper housing 102 using threaded fasteners (e.g., screws, etc.) 108. In another example, the lower housing 104 may be assembled (fastened) to the upper housing 102 using one or more of snap hooks, heat staking, swaging, and laser welding. In an example where the lower housing 104 comprises a plastic material, the lower housing 104 may be assembled (fastened) to the upper housing 102 using vibration welding. In an example, the subassembly 106 may be assembled by attaching a connector assembly 110 to a circuit board assembly 112, then inserting the connector assembly 110 and circuit board assembly 112 into the upper housing 102.

In various embodiments, a sealant material (not shown) may be applied between one or more of the upper housing 102, the lower housing 104, the connector assembly 110, and the circuit board assembly 112. In an example, a first sealant bead may be applied to, or deposited/dispensed onto, the upper housing 102 or the connector assembly 110, and a second sealant bead may be applied to, or deposited/dispensed onto, either the lower housing 104 or the assembly comprising the upper housing 102 and the subassembly 106. In an example, the second sealant bead may be configured to make contact or blend with ends of the first sealant bead to complete the environmental seal.

In various embodiments, the upper housing 102 comprises a back wall 140, two side walls 142, and a top wall 144. The back wall 140 and the two side walls 142 each extend from and are generally perpendicular to the top wall 144. The two side walls are spaced apart and generally parallel to one-another and generally perpendicular to the back wall 140. Each of the two side walls 142 defines a first sealing feature 114 upon which a sealant may be deposited. In various embodiments, the upper housing 102 comprises two instances of the first sealing feature 114, one on a left side of an opening for the connector assembly 110 and one on a right side of the opening. FIG. 2 generally illustrates interior and exterior appearances of a three-dimensional contour of the first sealing features 114. In various embodiments, the first sealing features 114 generally comprise one or more sloped portions. In various embodiments, the sloped portions of the first sealing features 114 may be configured to cooperate with a viscosity and/or adhesive characteristic of the sealant to minimize flow of the sealant when the sealant is applied to the first sealing features 114. In an example, the sloped portions of the first sealing features 114 may have a slope of approximately forty-five degrees. Other slopes may be implemented to meet design criteria of a particular implementation. In an example, the sloped portions of the first sealing features 114 may be displaced laterally from each other (e.g., similar to switchbacks on a mountain trail) to form a cascading channel into which the sealant may be dispensed.

In various embodiments, the upper housing 102 further comprises a first alignment feature 116 and the connector assembly 110 comprises a second alignment feature 118. The first alignment feature 116 of the upper housing is generally configured to interlock with the second alignment feature 118 of the connector assembly 110. In an example, the first alignment feature 116 may comprise a rib that runs along the connector opening of the upper housing 102. In an example, the second alignment feature 118 may comprise a channel (or slot) that runs along three sides of the connector assembly 110. In another example, the first alignment feature 116 may comprise the channel (or slot), which runs along the connector opening of the upper housing 102, and the second alignment feature 118 may comprise the rib, which runs along the three sides of the connector assembly 110. The first alignment feature 116 is generally configured to fit within the second alignment feature 118. The first alignment feature 116 is generally configured to align and guide the connector assembly 110 (and associated components) of the subassembly 106 during assembly into the upper housing 102. In an example, the first alignment feature 116 may have two (e.g., a right and a left) ends that may be tapered (or chamfered) to facilitate insertion into the second alignment feature 118.

In various embodiments, the connector assembly 110 further comprises a second sealing feature 120. In various embodiments, the connector assembly 110 comprises two instances of the second sealing feature 120, one on a left side of the connector assembly 110 and one on a right side of the connector assembly 110. The sealing features 120 generally comprise one or more sloped portions. The one or more sloped portions are generally configured to correspond to (match) the one or more sloped portions of the first sealing features 114. In various embodiments, the sloped portions of the second sealing features 120 are generally configured to match a contour of the one or more sloped portions of the first sealing features 114. In an example, the one or more sloped portions of the second sealing features 120 may have a slope of approximately forty-five degrees. Other slopes may be implemented to meet design criteria of a particular implementation.

In an example, the one or more sloped portions of the second sealing features 120 may comprise a cascading rib configured to compress the sealant applied to one or more sloped portions of the first sealing features 114. In various embodiments, the cascading rib of the second sealing features 120 may be configured to interlock with the cascading channel formed by the first sealing features 114 such that the sealant applied to the first sealing features 114 is compressed and forms a seal between the first sealing features 114 and the second sealing features 120. In an example, the first sealing features 114 may have a rounded (e.g., concave) profile that maximizes sealing surface area when the sealant is compressed by the second sealing features 120. In an example, the cascading rib formed by the second sealing features 120 may be more narrow than the cascading channel of the first sealing features 114. In another example, the cascading rib may be formed by the first sealing features 114 and the cascading channel may be formed by the second sealing features 120.

In an example, an assembly process for the subassembly 106 may comprise a number of steps. In an example, a raw terminal carrier may be fed to a stitching station. The stitching station may stitch a row of terminal pins into the raw carrier. The stitching station may then pass the stitched carrier to a form station, where the form station forms an appropriate (e.g., 90 degrees, etc.) bend for the current row. The stitching and forming processes may be repeated until a number or rows of terminal pins desired have been stitched and formed to produced a completed terminal carrier assembly. The completed terminal carrier assembly may then be assembled to one or more connector shrouds of the connector assembly 110. The connector assembly 110 may then be assembled to a printed circuit board substrate of the circuit board assembly 112 to form the subassembly 106.

In various embodiments, the connector assembly 110 generally includes the second alignment feature 118. The second alignment feature 118 is generally configured to align the connector assembly 110 with an interior surface (e.g., sides) of the upper housing 102. In various embodiments, a profile of the connector assembly 110 and the second alignment feature 118 may be configured to align the circuit board assembly 112 within the upper housing 102. In various embodiments, the circuit board assembly 112 may include vias that may be aligned with press-fit pins of insulation displacement terminals (IDTs) inserted in the upper housing 102. The IDTs may be used to connect one or more components mounted in the upper housing 102 to the circuit board assembly 112. In various embodiments, a press fit connection may be formed between the circuit board assembly 112 and the IDTs in the upper housing 102 as the subassembly 106 is assembled into the upper housing 102.

Figure 3:
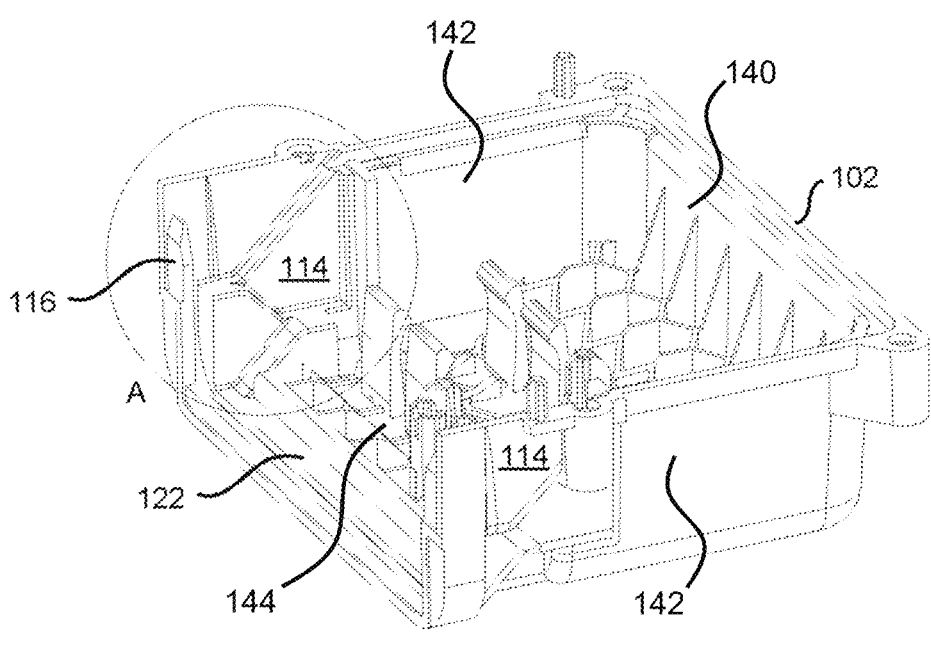
FIG. 3 is a diagram illustrating a sealing feature of an upper housing of the sealed electronic control module housing in accordance with an example embodiment of the invention.

Referring to FIG. 3, a diagram is shown illustrating the first sealing features 114 and the first alignment feature 116 of the upper housing 102 of the sealed electronic control module housing 100 in accordance with an example embodiment of the invention. In various embodiments, two instances of the first sealing features 114 may be implemented in the upper housing 102 of the sealed electronic control module housing 100, one on each side of an opening in the upper housing 102 configured to receive the connector assembly 110. In various embodiments, cascading channels formed by the two instances of the first sealing features 114 may be connected by a channel 122 that runs between a bottom of the two instances of the first sealing features 114. In embodiments where cascading ribs are formed by the two instances of the first sealing features 114, the channel 122 may be replaced by a rib. The two instances of the first sealing features 114 and the channel/rib 122 generally facilitate using a continuous bead of sealant material to seal an interface between the upper housing 102 and the connector assembly 110.

Figure 4:
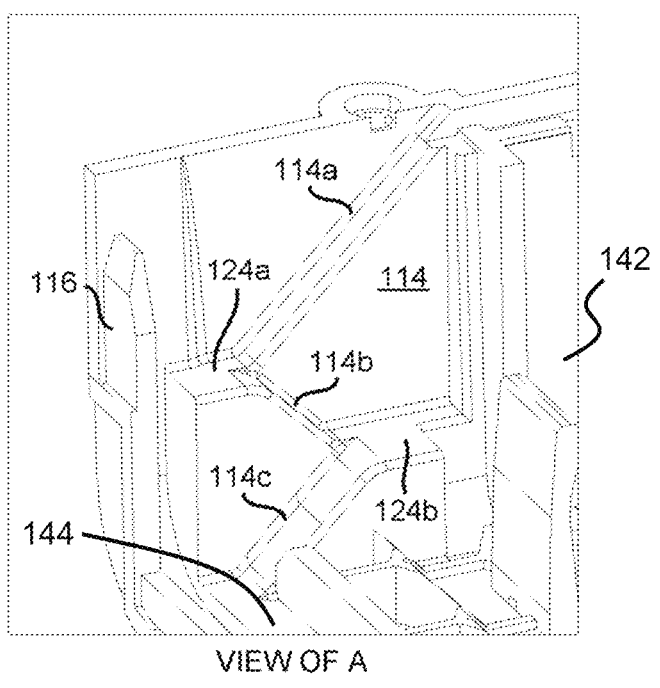
FIG. 4 is a diagram illustrating an enlarged view of the sealing feature of the upper housing of the sealed electronic control module housing in accordance with an example embodiment of the invention.

Referring to FIG. 4, a diagram is shown illustrating an enlarged view of one of the first sealing features 114 of the upper housing 102 of the sealed electronic control module housing 100 in accordance with an example embodiment of the invention. In various embodiments, the first sealing features 114 of the upper housing 102 comprise one or more first ramp features 114a-114c upon which the sealant may be deposited. The one or more first ramp features 114a-114c are generally sloped. In various embodiments, the slope of the one or more first ramp features 114a-114c may be configured to cooperate with a viscosity and adhesive characteristic of the sealant to minimize flow of the sealant when applied to the one or more first ramp features 114a-114c. In an example, the one or more first ramp features 114a-114c may have a slope of approximately forty-five degrees. Other slopes may be implemented to meet design criteria of a particular implementation. In an example, the one or more first ramp features 114a-114c may be connected by one or more plateaus 124a-124b. The one or more first ramp features 114a-114c generally switch direction at the one or more plateaus 124a-124b. In an example, the one or more first ramp features 114a-114c and the one or more plateaus 124a-124b may form a cascading channel into which the sealant may be dispensed. A continuous bead of a sealant is generally formed by dispensing the sealant into the cascading channels formed by the two instances of the first sealing features 114 and the channel 122 connecting the two instances of the first sealing features 114. As shown in FIG. 4, the one or more first ramp features 114a-114c include a first descending ramp feature 114c that extends at an angle from the top wall 144, toward the back wall 140, and to a first plateau 124b of the one or more plateaus 124a-124b. The one or more first ramp features 114a-114c also include a second ramp feature 124b that extends at an angle from the first plateau 124b, away from the top wall 144, away from the back wall 140, and to a second plateau 124a of the one or more plateaus 124a-124b. The one or more first ramp features 114a-114c also include a third ramp feature 124a that extends at an angle from the second plateau 124a, away from the top wall 144, toward from the back wall 140. The first ramp features 114a-114c define a zig-zag pattern, alternating between extending toward and away from the back wall 140. Each of the first ramp features 114a-114c also extends generally in a plane with one of the two side walls 142. The first plateau 124b and the second plateau 124a are each generally parallel to, and spaced apart from, one another and the top wall 144.

Figure 5:
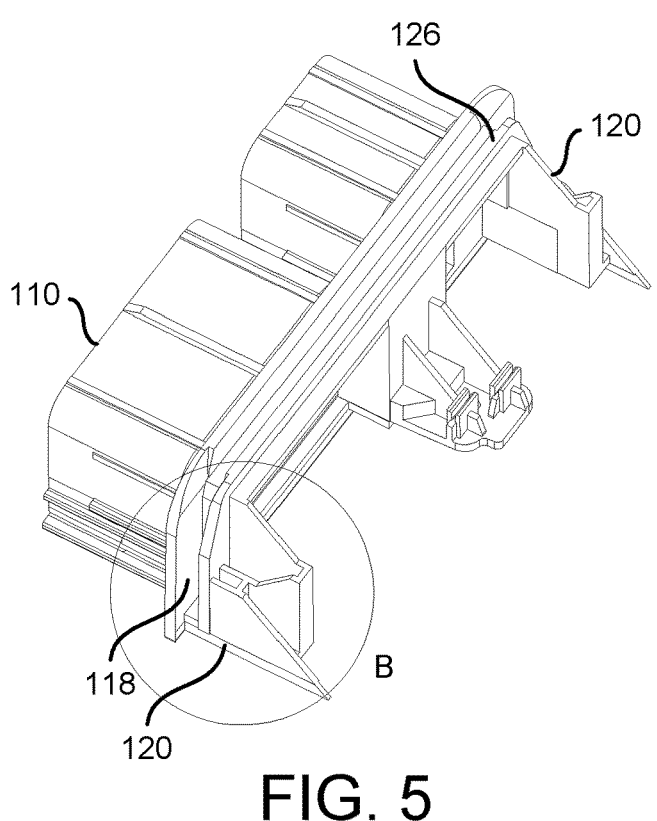
FIG. 5 is a diagram illustrating a sealing feature of a connector assembly of the sealed electronic control module housing in accordance with an example embodiment of the invention.

Referring to FIG. 5, a diagram is shown illustrating the second sealing features 120 and the second alignment feature 118 of a connector assembly 110 of the sealed electronic control module housing 100 in accordance with an example embodiment of the invention. In various embodiments, two instances of the second sealing features 120 may be implemented in the connector assembly 110, one on each side of the connector assembly 110. In various embodiments, the two instances of the second sealing features 120 are connected by a rib 126 that runs across an upper edge of the connector assembly 110 between the two instances of the second sealing features 120. In embodiments where cascading channels are formed by the two instances of the second sealing features 120, the rib 126 may be replaced by a channel. The two instances of the second sealing features 120 and the rib/channel 126 generally facilitate using a continuous bead of sealant material to seal an interface between the upper housing 102 and the connector assembly 110.

Figure 6:
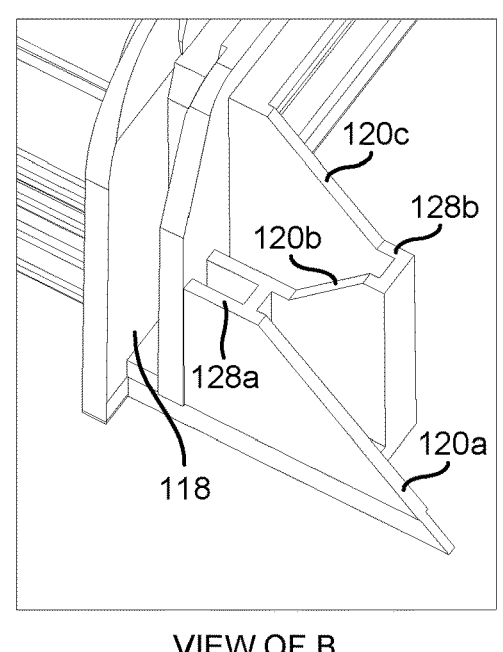
FIG. 6 is a diagram illustrating an enlarged view of the sealing feature of the connector assembly of the sealed electronic control module housing in accordance with an example embodiment of the invention.
Figure 7:
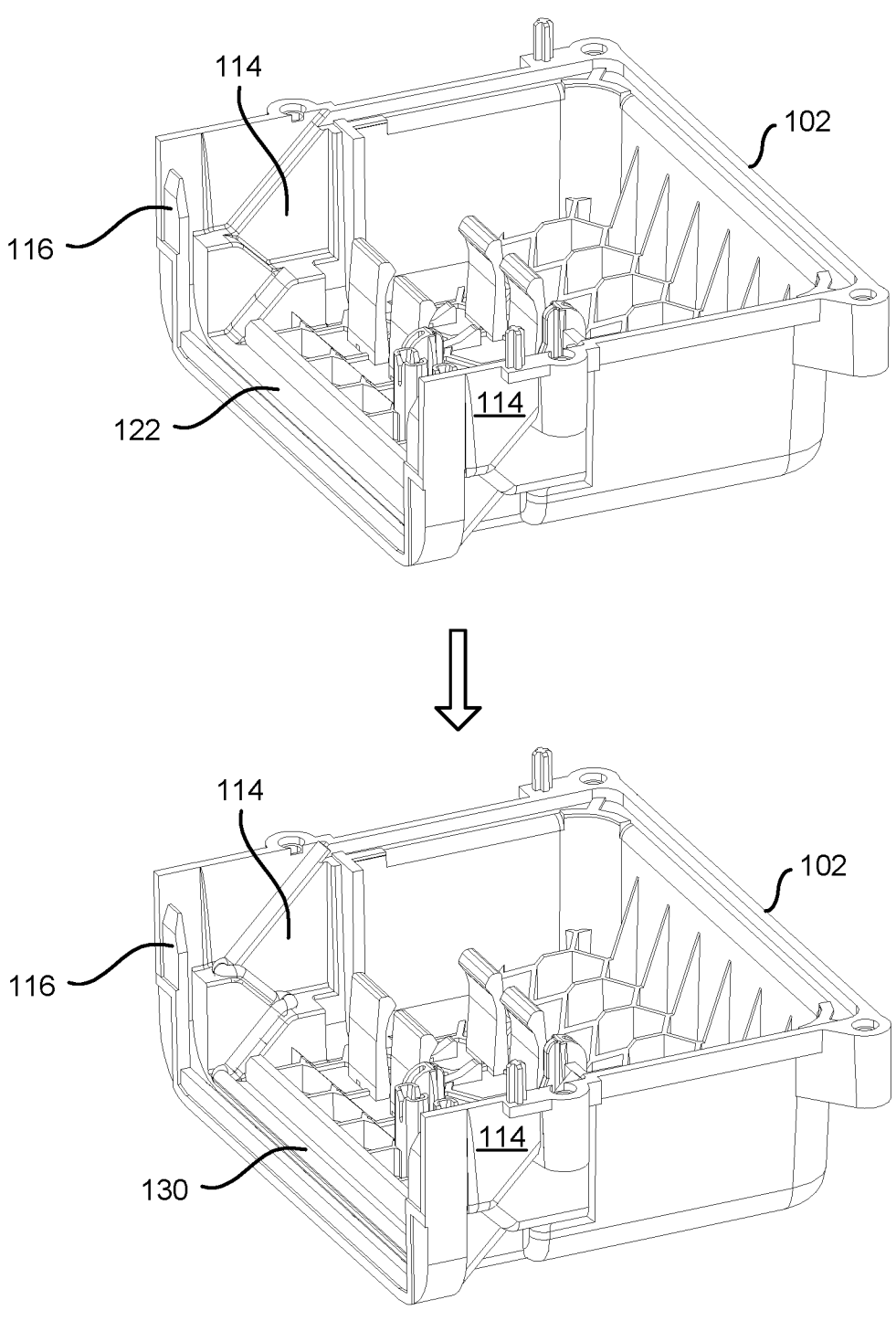
FIGS. 7-10 are diagrams illustrating an assembly process of the sealed electronic control module housing in accordance with an example embodiment of the invention.
Figure 8:
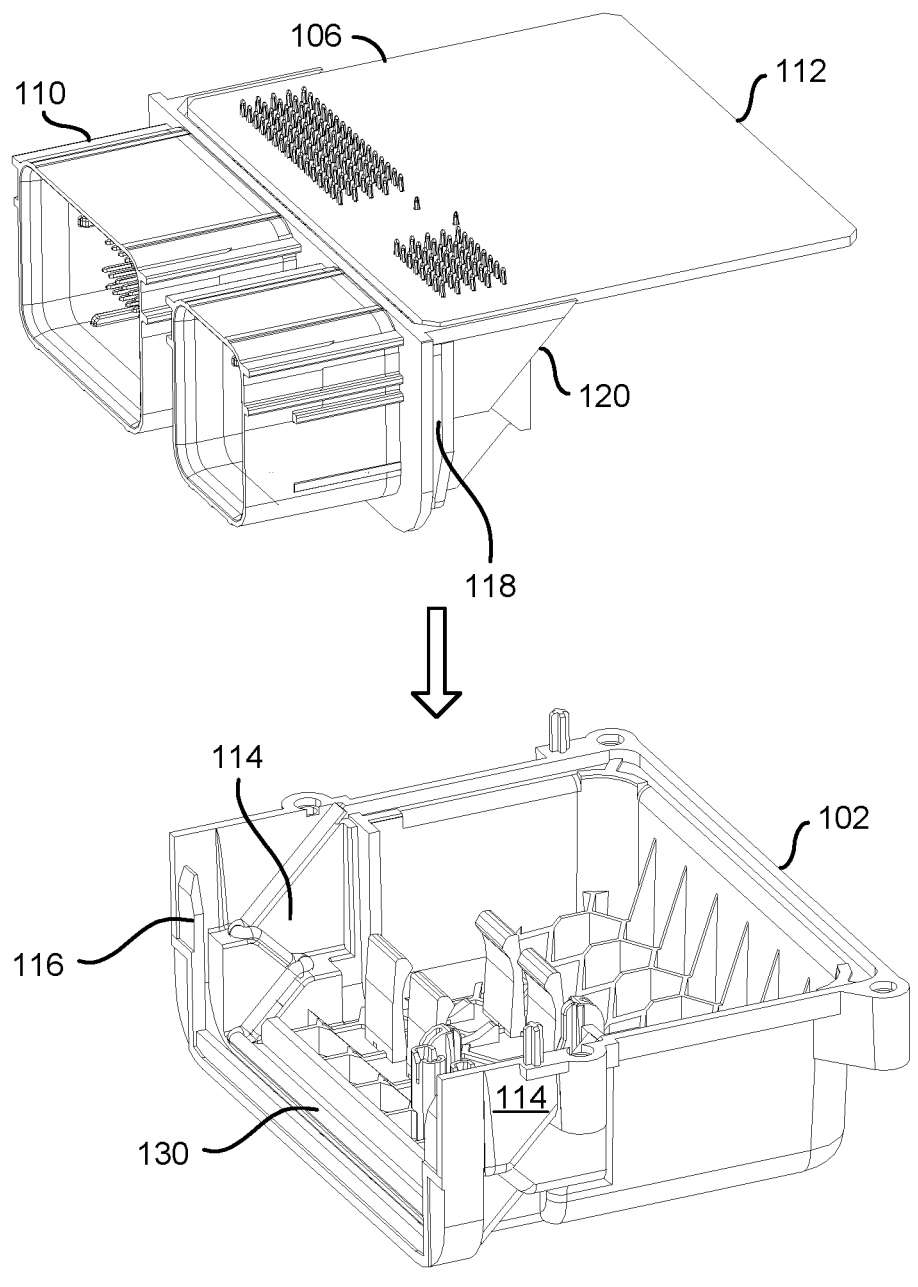
Figure 11:
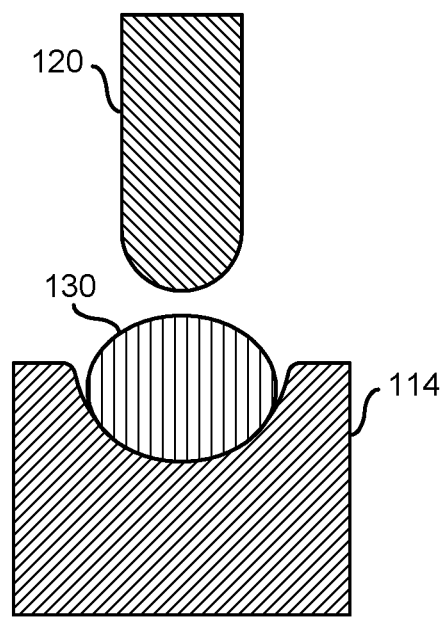
FIG. 11 is a diagram illustrating a sealant bead applied to the sealing feature of the upper housing of the sealed electronic control module housing prior to assembly with the sealing feature of the connector assembly.
Figure 12:
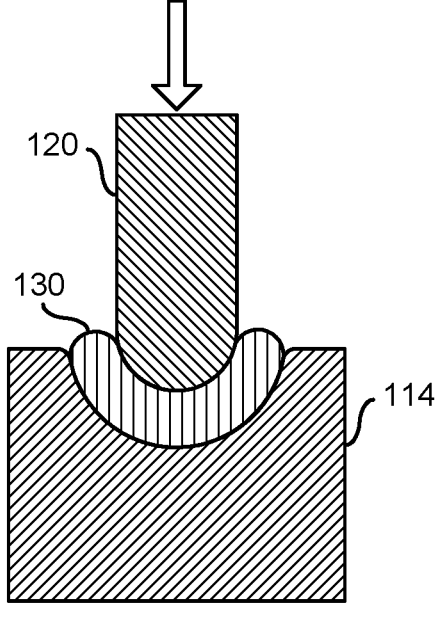
FIG. 12 is a diagram illustrating compression of the sealant bead applied to the sealing feature of the upper housing of the sealed electronic control module housing after assembly with the sealing feature of the connector assembly.

Referring to FIG. 6, a diagram is shown illustrating an enlarged view of one of the second sealing features 120 of the connector assembly 110 in accordance with an example embodiment of the invention. In various embodiments, the second sealing features 120 of the connector assembly 110 comprise one or more second ramp features 120a-120c. The one or more second ramp features 120a-120c are generally sloped. In an example, the one or more second ramp features 120a-120c are generally configured to match the slope of the one or more first ramp features 114a-114c. In an example, the one or more second ramp features 120a-120c may have a slope of approximately forty-five degrees. Other slopes may be implemented to meet design criteria of a particular implementation. In an example, the one or more second ramp features 120a-120c may be connected by one or more plateaus 128a-128b. The one or more second ramp features 120a-120c generally switch direction at the one or more plateaus 128a-128b. In an example, the one or more second ramp features 120a-120c, the rib 126, and the one or more plateaus 128a-128b may form a cascading rib configured to compress the sealant deposited on the cascading channel formed by the one or more first ramp features 114a-114c, the channel 122, and the plateaus 124a-124b of the upper housing 102. In an example, the one or more second ramp features 120a-120c of the second sealing features 120 and the rib 126 may have a rounded (e.g., convex) profile that maximizes sealing surface area when pressed into the sealant deposited in the cascading channel of the first sealing features 114 and the channel 122. In an example, the cascading rib formed by the second sealing features 120a-120c may be more narrow than the cascading channel formed by the first sealing features 114 (e.g., as illustrated in FIGS. 11 and 12).

Figure 9:
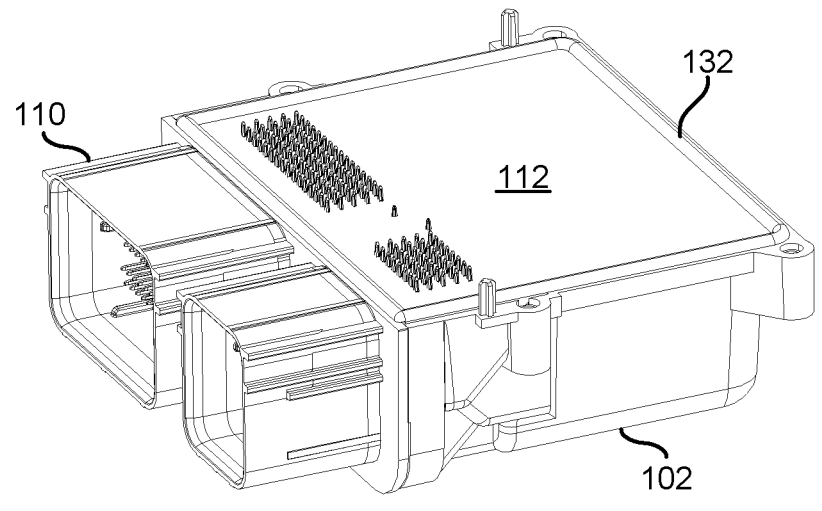

Referring to FIGS. 7-10, diagrams are shown illustrating an assembly process of the sealed electronic control module housing 100 in accordance with an example embodiment of the invention. In a first step, illustrated in FIG. 7, the upper housing 102 may be placed in an assembly fixture with the interior volume facing upward. A first bead of sealant material 130 may be then be deposited on the first sealing features 114 and the channel 122. In a next step, illustrated in FIG. 8, the subassembly 106 may be inserted in the upper housing 102 using a vertical motion. In an example, the subassembly 106 may be placed above the upper housing 102 with the first alignment feature 116 and the second alignment feature 118 align. The subassembly 106 may be moved vertically downward to engage the first alignment feature 116 into the second alignment feature 118. With the first alignment feature 116 and the second alignment feature 118 meshed, the subassembly 106 may continue to be moved vertically downward until located within the upper housing 102 (as illustrated in FIG. 9).

As the subassembly 106 is moved vertically downward into the upper housing 102, the second sealing features 120 and rib 126 generally make contact with the bead of sealing material 130. As the subassembly 106 is pressed vertically downward into a final position within the upper housing 102, the bead of sealing material 130 is compressed between a) the second sealing features 120 and the rib 126, and b) the first sealing features 114 and the channel 122, forming an environmental seal between the upper housing 102 and the connector assembly 110.

Figure 10:
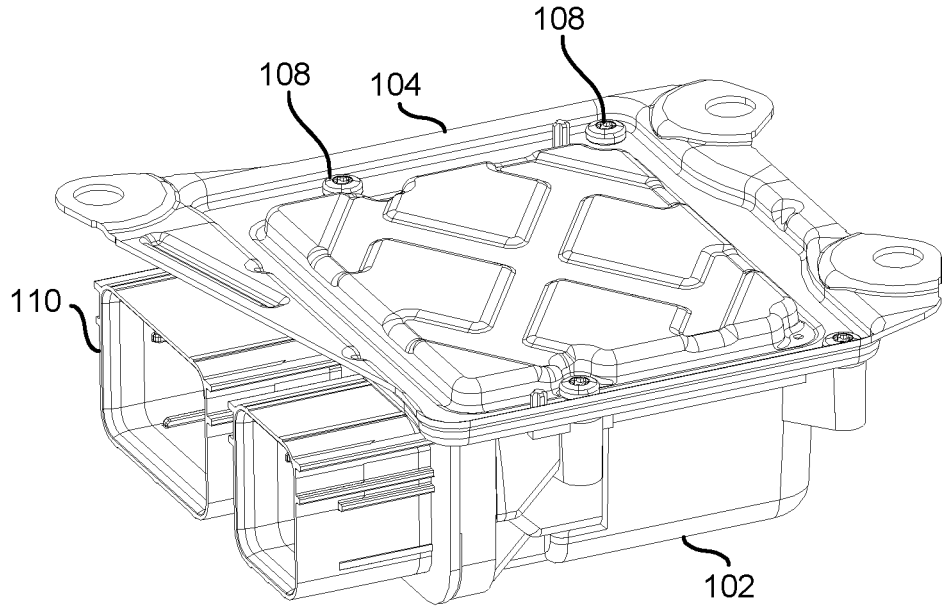

In a next step, illustrated in FIG. 9, a second bead of sealing material 132 may be deposited around a periphery of the printed circuit board 112. In an example, the second bead of sealant material 132 may be applied/deposited/dispensed to make contact or blend with ends of the first sealant bead 130 to complete the environmental seal of the connector assembly 110. The lower housing 104 may then be assembled to the upper housing 102 (e.g., as illustrated in FIG. 10). In an example, the lower housing 104 may be assembled (fastened) to the upper housing 102 using threaded fasteners (e.g., screws, etc.) 108. In another example, the lower housing 104 may be assembled (fastened) to the upper housing 102 using one or more of snap hooks, heat staking, swaging, and laser welding. In an example where the lower housing 104 comprises a plastic material, the lower housing 104 may be assembled (fastened) to the upper housing 102 using vibration welding. The assembled electronic control unit (or module) may then be removed from the assembly fixture and the process repeated for other electronic control units (or modules). In various embodiments, an assembly process using the sealed electronic control unit (or module) housing 100 in accordance with an embodiment of the invention may (i) avoid a separate curing process or separate component to compress the sealant material and/or (ii) allow assembly a sealed electronic control unit (or module) without reorienting the parts during the assembly process.

Referring to FIG. 11, a diagram is shown illustrating a cross-sectional view of the sealant bead 130 applied to the first sealing feature 114 of the upper housing 102 of the sealed electronic control module housing 100 prior to the second sealing feature 120 of the connector assembly 110 making contact with the sealant bead 130. In an example, the first sealing feature 114 may have a rounded (e.g., concave) profile that accepts the bead of sealant material 130. In an example, the second sealing feature 120 may have a rounded (e.g., convex) profile that maximizes sealing surface area when pressed into the sealant bead 130 deposited in the channel of the first sealing feature 114.

Referring to FIG. 12, a diagram is shown illustrating compression of the sealant bead 130 between the first sealing feature 114 of the upper housing 102 and the second sealing feature 120 of the connector assembly 110 as the parts are assembled together. In an example, the sealant bead 130 spreads out to maximize the sealing surface area when the rib of the second feature 120 is pressed into the sealant bead 130 toward the channel of the first sealing feature 114.

Figure 13:
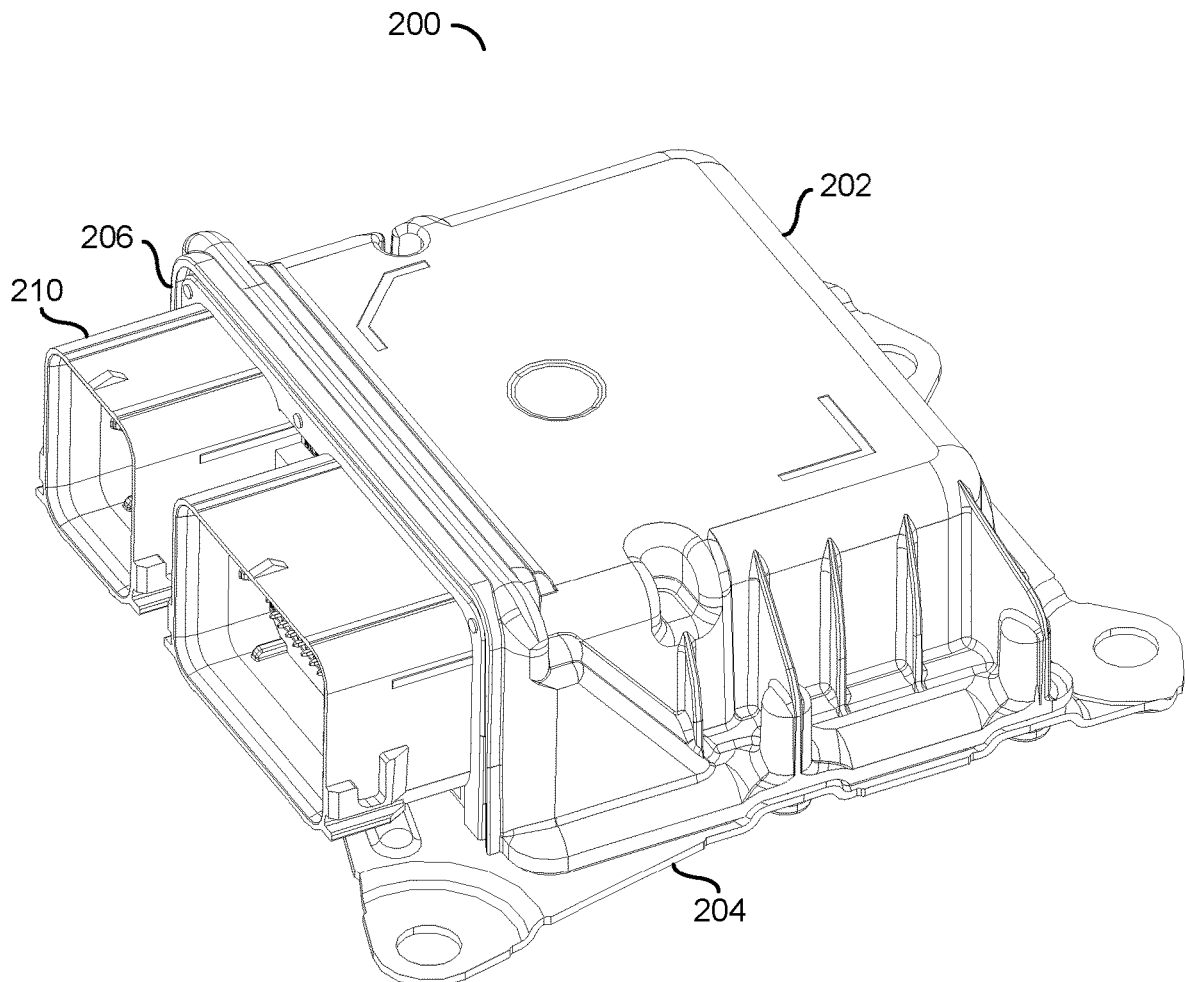
FIG. 13 is a diagram illustrating a perspective view of a sealed electronic control module housing in accordance with another example embodiment of the invention.

Referring to FIG. 13, a diagram is shown illustrating a perspective view of an apparatus 200 in accordance with another example embodiment of the invention. In various embodiments, the apparatus 200 may implement a sealed electronic control unit (or module) housing. The apparatus 200 generally comprises an upper housing 202, a lower housing (or cover or baseplate) 204, and a subassembly 206.

In an example, the upper housing 202 may be implemented as a nonconductive enclosure. While mated with the lower housing 204 and the subassembly 206, the upper housing 202 may be configured to provide an environmentally sealed enclosure. The enclosure may protect components and devices of the subassembly 206. In various embodiments, the upper housing 202 generally comprises a plastic or resin-based material. In various embodiments, the plastic or resin-based material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. Other materials may be implemented to meet the design criteria of a particular application.

In various embodiments, the lower housing 204 may be implemented using a metal or metal-alloy material, or a plastic or resin-based material similar to the upper housing 202. In an example, the lower housing 204 may be implemented as an electrically conductive baseplate. The lower housing 204 is generally configured to provide mechanical support, thermal cooling, and/or electrical grounding for the apparatus 200. In various embodiments, the lower housing 204 may comprise a die-cast Aluminum baseplate. In another example, the lower housing 204 may be implemented as a stamped steel baseplate. Implementing the lower housing 204 with a metallic material may aid in dissipating heat generated by circuitry within the apparatus 200. The lower housing 204 is generally configured to provide a mounting footprint for the apparatus 200. In an example, the lower housing 204 may be implemented with a mounting footprint that simplifies testing. Other footprints may be implemented to meet the design criteria of a particular application.

The subassembly (or electrical assembly) 206 may implement an electronic component of the apparatus 200. The subassembly 206 may be operational to perform one or more electrical functions. The electrical functions may include, but are not limited to, providing grounding paths for all electrical components inside the apparatus 200 to the exterior of the apparatus 200, transferring electrical inputs from different circuits in the vehicle to electronic components mounted inside the apparatus 200, monitoring the performance of electronic sensors in the vehicle and/or transmitting acceleration changes in the vehicle to the electronic components mounted in the apparatus 200. In various embodiments, the subassembly 206 generally comprises a connector assembly having one or more integrated connectors attached to one or more printed circuit boards. The connector assembly is generally configured to form a fifth side of the upper housing 202. The connector assembly of the subassembly 206 is generally secured to the upper housing 202 by a sealing feature that interlocks with a corresponding sealing feature of the upper housing 202. The one or more printed circuit boards may contain electrical circuitry configured to perform the electrical functions of an electronic control unit (ECU).

Referring to FIG. 14, a diagram is shown illustrating an exploded view of an electronic control unit (or module) implemented with the sealed electronic control module housing 200 of FIG. 13. In an example, assembly of the sealed electronic control module housing 200 may comprise assembling the subassembly 206 into the upper housing 202 and assembling the lower housing 204 to the upper housing 202. In an example, the lower housing 204 may be assembled (fastened) to the upper housing 202 using threaded fasteners (e.g., screws, etc.) 208. In another example, the lower housing 204 may be assembled (fastened) to the upper housing 202 using one or more of snap hooks, heat staking, swaging, and laser welding. In an example where the lower housing 204 comprises a plastic material, the lower housing 204 may be assembled (fastened) to the upper housing 202 using vibration welding. In an example, the subassembly 206 may be assembled by attaching a connector assembly 210 to a circuit board assembly 212, then inserting the connector assembly 210 and circuit board assembly 212 into the upper housing 202. In various embodiments, a sealant material (not shown) may be applied between one or more of the upper housing 202, the lower housing 204, the connector assembly 210, and the circuit board assembly 212.

In various embodiments, the upper housing 202 comprises a first sealing feature 214 upon which a sealant may be deposited. In various embodiments, the upper housing 202 comprises two instances of the first sealing feature 214, one on a left side of an opening for the connector assembly 210 and one on a right side of the opening. FIG. 14 generally illustrates interior and exterior appearances of a three-dimensional contour of the first sealing features 214. In various embodiments, the first sealing features 214 generally comprise one or more sloped portions. In various embodiments, the sloped portions of the first sealing features 214 may be configured to cooperate with a viscosity and/or adhesive characteristic of the sealant to minimize flow of the sealant when the sealant is applied to the first sealing features 214. In an example, the sloped portions of the first sealing features 214 may have a slope of approximately forty-five degrees. Other slopes may be implemented to meet design criteria of a particular implementation.

In various embodiments, the upper housing 202 further comprises a first alignment feature 216 and the connector assembly 210 comprises a second alignment feature 218. The first alignment feature 216 of the upper housing 202 is generally configured to interlock with the second alignment feature 218 of the connector assembly 210. In an example, the first alignment feature 216 may comprise a rib that runs along the connector opening of the upper housing 202. In an example, the second alignment feature 218 may comprise a channel (or slot) that runs along three sides of the connector assembly 210. In another example, the first alignment feature 216 may comprise the channel (or slot), which runs along the connector opening of the upper housing 202, and the second alignment feature 218 may comprise the rib, which runs along the three sides of the connector assembly 210. The first alignment feature 216 is generally configured to fit within the second alignment feature 218. The first alignment feature 216 is generally configured to align and guide the connector assembly 210 (and associated components) of the subassembly 206 during assembly into the upper housing 202. In an example, the first alignment feature 216 may have two (e.g., a right and a left) ends that may be tapered (or chamfered) to facilitate insertion into the second alignment feature 218.

In various embodiments, the connector assembly 210 further comprises a second sealing feature 220. In various embodiments, the connector assembly 210 comprises two instances of the second sealing feature 220, one on a left side of the connector assembly 210 and one on a right side of the connector assembly 210. The sealing features 220 generally comprise one or more sloped portions. The one or more sloped portions are generally configured to correspond to (match) the one or more sloped portions of the first sealing features 214. In various embodiments, the sloped portions of the second sealing features 220 are generally configured to match a contour of the one or more sloped portions of the first sealing features 214. In an example, the one or more sloped portions of the second sealing features 220 may have a slope of approximately forty-five degrees. Other slopes may be implemented to meet design criteria of a particular implementation.

In an example, the one or more sloped portions of the second sealing features 220 may comprise a rib configured to compress the sealant applied to one or more sloped portions of the first sealing features 214. In various embodiments, the rib of the second sealing features 220 may be configured to interlock with a channel formed by the first sealing features 214 such that the sealant applied to the first sealing features 214 is compressed and forms a seal between the first sealing features 214 and the second sealing features 220. In an example, the first sealing features 214 may have a rounded (e.g., concave) profile that maximizes sealing surface area when the sealant is compressed by the second sealing features 220. In an example, the rib formed by the second sealing features 220 may be more narrow than the channel of the first sealing features 214. In another example, the rib may be formed by the first sealing features 214 and the channel may be formed by the second sealing features 220.

In an example, an assembly process for the subassembly 206 may comprise a number of steps. In an example, a raw terminal carrier may be fed to a stitching station. The stitching station may stitch a row of terminal pins into the raw carrier. The stitching station may then pass the stitched carrier to a form station, where the form station forms an appropriate (e.g., 90 degrees, etc.) bend for the current row. The stitching and forming processes may be repeated until a number or rows of terminal pins desired have been stitched and formed to produced a completed terminal carrier assembly. The completed terminal carrier assembly may then be assembled to one or more connector shrouds of the connector assembly 210. The connector assembly 210 may then be assembled to a printed circuit board substrate of the circuit board assembly 212 to form the subassembly 206.

In various embodiments, the connector assembly 210 generally includes the second alignment feature 218. The second alignment feature 218 is generally configured to align the connector assembly 210 with an interior surface (e.g., sides) of the upper housing 202. In various embodiments, a profile of the connector assembly 210 and the second alignment feature 218 may be configured to align the circuit board assembly 212 within the upper housing 202. In various embodiments, the circuit board assembly 212 may include vias that may be aligned with press-fit pins of insulation displacement terminals (IDTs) inserted in the upper housing 202. The IDTs may be used to connect one or more components mounted in the upper housing 202 to the circuit board assembly 212. In various embodiments, a press fit connection may be formed between the circuit board assembly 212 and the IDTs in the upper housing 202 as the subassembly 206 is assembled into the upper housing 202.

Figure 15:
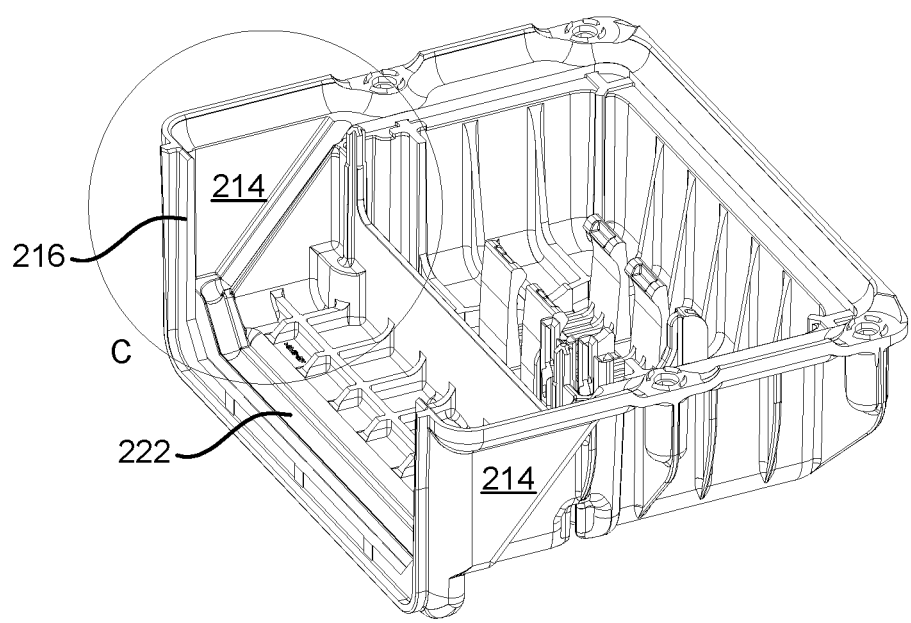
FIG. 15 is a diagram illustrating a sealing feature of an upper housing of the sealed electronic control module housing of FIG. 13.

Referring to FIG. 15, a diagram is shown illustrating the first sealing features 214 and the first alignment feature 216 of the upper housing 202 of the sealed electronic control module housing 200 in accordance with an example embodiment of the invention. In various embodiments, two instances of the first sealing features 214 may be implemented in the upper housing 202 of the sealed electronic control module housing 200, one on each side of an opening in the upper housing 202 configured to receive the connector assembly 210. In various embodiments, channels formed by the two instances of the first sealing features 214 are connected by a channel 222 that runs between a bottom of the two instances of the first sealing features 214. In embodiments where ribs are formed by the two instances of the first sealing features 214, the channel 222 may be replaced by a rib. The two instances of the first sealing features 214 and the channel/rib 222 generally facilitate using a continuous bead of sealant material to seal an interface between the upper housing 202 and the connector assembly 210.

Figure 16:
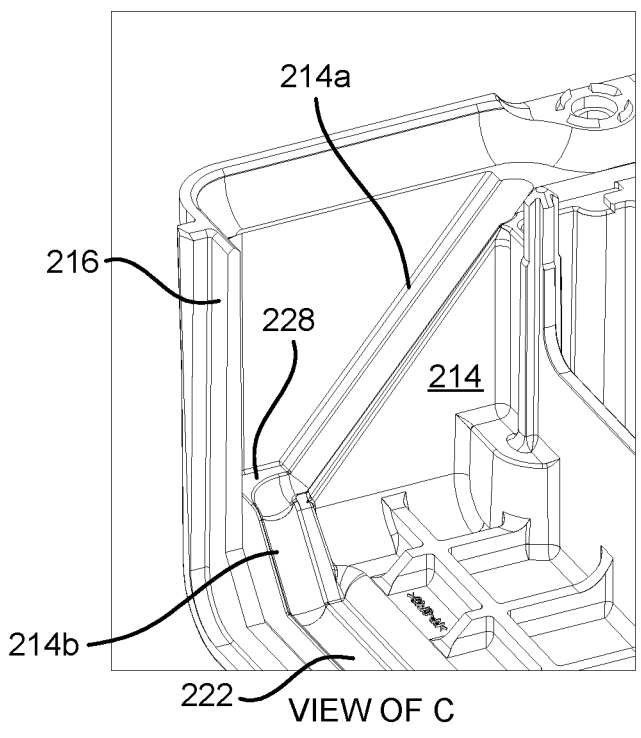
FIG. 16 is a diagram illustrating an enlarged view of the sealing feature of the upper housing of the sealed electronic control module housing of FIG. 13.

Referring to FIG. 16, a diagram is shown illustrating an enlarged view of one of the first sealing features 214 of the upper housing 202 of the sealed electronic control module housing 200 in accordance with an example embodiment of the invention. In various embodiments, the first sealing features 214 of the upper housing 202 comprise one or more first ramp features 214a-214b upon which the sealant may be deposited. The one or more first ramp features 214a-214b are generally sloped. In various embodiments, the slope of the one or more first ramp features 214a-214b may be configured to cooperate with a viscosity and adhesive characteristic of the sealant to minimize flow of the sealant when applied to the one or more first ramp features 214a-214b. In an example, the one or more first ramp features 214a-214b may have a slope of approximately forty-five degrees. Other slopes may be implemented to meet design criteria of a particular implementation. In an example, the one or more first ramp features 214a-214b may be connected by one or more plateaus 224. The one or more first ramp features 214a-214b generally change direction at the one or more plateaus 224. In an example, the one or more first ramp features 214a-214b and the one or more plateaus 224 may form a sloping channel with a right-angle bend into which the sealant may be dispensed. A continuous bead of a sealant is generally formed by dispensing the sealant into the sloping channels with the right-angle bends formed by the two instances of the first sealing features 214 and a channel 222 connecting the two instances of the first sealing features 214.

Figure 17:
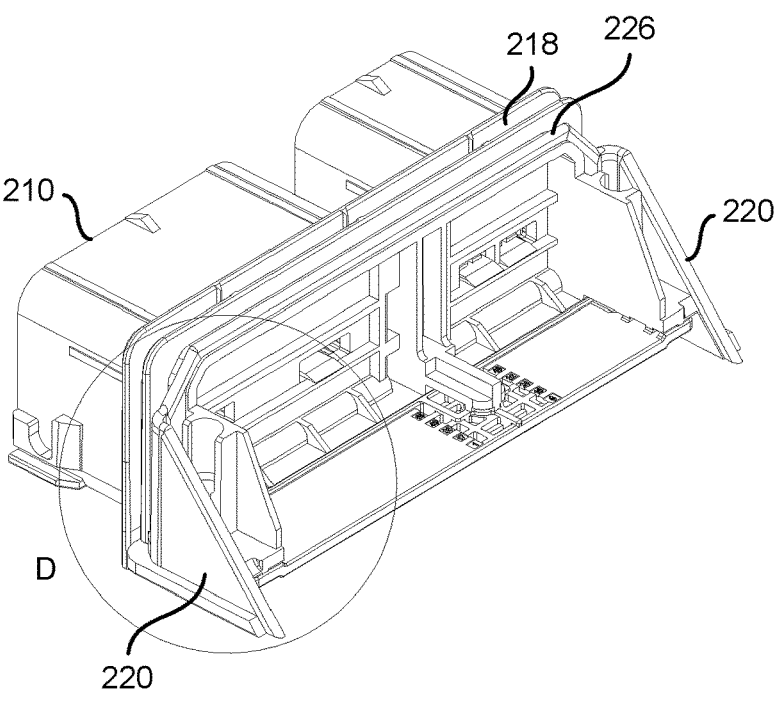
FIG. 17 is a diagram illustrating a sealing feature of a connector assembly of the sealed electronic control module housing of FIG. 13.

Referring to FIG. 17, a diagram is shown illustrating the second sealing features 220 and the second alignment feature 218 of a connector assembly 210 of the sealed electronic control module housing 200 in accordance with an example embodiment of the invention. In various embodiments, two instances of the second sealing features 220 may be implemented in the connector assembly 210, one on each side of the connector assembly 210. In embodiments where channels are formed by the two instances of the second sealing features 220, the rib 226 may be replaced by a channel. In various embodiments, the two instances of the second sealing features 220 may be connected by a rib/channel 226 that runs across an upper edge of the connector assembly 210 between the two instances of the second sealing features 220. The two instances of the second sealing features 220 and the rib 226 generally facilitate using a continuous bead of sealant material to seal an interface between the upper housing 202 and the connector assembly 210.

Figure 18:
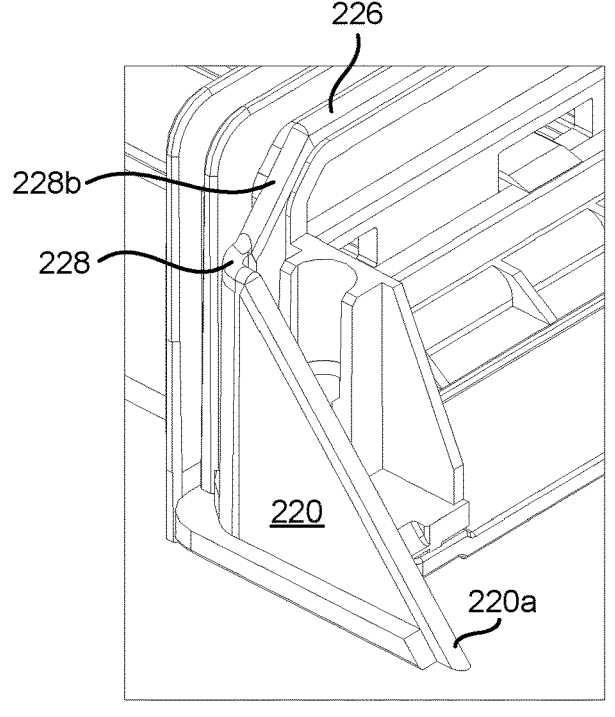
FIG. 18 is a diagram illustrating an enlarged view of the sealing feature of the connector assembly of the sealed electronic control module housing of FIG. 17.

Referring to FIG. 18, a diagram is shown illustrating an enlarged view of one of the second sealing features 220 of the connector assembly 210 in accordance with an example embodiment of the invention. In various embodiments, the second sealing features 220 of the connector assembly 210 comprise one or more second ramp features 220a-220b. The one or more second ramp features 220a-220b are generally sloped. In an example, the one or more second ramp features 220a-220b are generally configured to match the slope of the one or more first ramp features 214a-214b. In an example, the one or more second ramp features 220a-220b may have a slope of approximately forty-five degrees. Other slopes may be implemented to meet design criteria of a particular implementation.

In an example, the one or more second ramp features 220a-220b may be connected by one or more plateaus 228. The one or more second ramp features 220a-220b generally change direction at the one or more plateaus 220a-220b. In an example, the one or more second ramp features 220a-220b, the rib 226, and the one or more plateaus 228 may form a continuous rib configured to compress the sealant deposited on the channel formed by the one or more first ramp features 214a-214b, the channel 222, and the plateaus 228 of the upper housing 202. In an example, the one or more second ramp features 220a-220b of the second sealing features 220 and the rib 226 may have a rounded (e.g., convex) profile that maximizes sealing surface area when pressed into the sealant deposited in the channel of the first sealing features 214 and the channel 222. In an example, the continuous rib formed by the second sealing features 220 and the rib 226 may be more narrow than the channel formed by the first sealing features 214 and the channel 222 (e.g., as illustrated in FIGS. 11 and 12).

The structures illustrated in the diagrams of FIGS. 1 to 18 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art (s). Appropriate software, firmware, coding, routines, instructions, opcodes, microcode, and/or program modules may readily be prepared by skilled programmers based on the teachings of the present disclosure, as will also be apparent to those skilled in the relevant art (s). The software is generally embodied in a medium or several media, for example non-transitory storage media, and may be executed by one or more of the processors sequentially or in parallel.

Data signals generated by the sensor units (or devices) may be transferred to one or more electronic control units.

The electronic control units may utilize the sensor data in one or more transport vehicle functions including, but not limited to, engine control, transmission control, braking control, battery management, steering control, door control, human machine interface, seat control, speed control, restraint systems control, vehicle-to-vehicle communications and diagnostics. The electronic control units may include capabilities to adjust the sensor data to account for calibration issues, environmental factors and aging components.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   an upper housing comprising three sides extending perpendicularly from a fourth side, wherein said three sides include a back wall and two side walls extending generally parallel to and spaced apart from one another and generally perpendicularly to the back wall, wherein said four sides of said housing define a rectilinear volume and a connector opening, and said two side walls each define one or more first ramp features configured to hold a sealant; and
   a connector and printed circuit board subassembly comprising a connector assembly holding a plurality of terminal pins and attached to a printed circuit board substrate, wherein (a) said connector assembly extends perpendicularly from said printed circuit board substrate, (b) each of said plurality of terminal pins comprises a right angle bend, (c) a first end of each of said plurality of terminal pins is inserted into said printed circuit board substrate, (d) a second end of each of said plurality of terminal pins extend through said connector assembly, (e) said connector assembly comprises one or more second ramp features configured to mate with said one or more first ramp features of said upper housing, and (f) said upper housing is configured to (i) allow assembling of said connector and printed circuit board subassembly into said upper housing using a vertical motion and (ii) interlock with said connector assembly to hold said printed circuit board substrate with said connector assembly and said plurality of terminal pins in place within said housing, wherein the upper housing further includes a top wall, wherein the back wall and the two side walls each extend from and are generally perpendicular to the top wall, and wherein said one or more first ramp features includes a first descending ramp feature extending at an angle from the top wall, toward the back wall, and in a plane with one of the two side walls, and wherein said one or more first ramp features further includes a second descending ramp feature extending at an angle away from the top wall, away from the back wall, and in the plane with the one of the two side walls.

2. The apparatus according to claim 1, wherein said one or more first ramp features and said one or more second ramp features are sloped at approximately forty-five degrees.

3. The apparatus according to claim 1, wherein said sealant has a material property to hold said sealant on a slope of said one or more first ramp features.

4. The apparatus according to claim 1, wherein one of said one or more first ramp features and said one or more second ramp features form a cascading channel into which said sealant is dispensed and the other of and said one or more first ramp features and said one or more second ramp features form a cascading rib configured to compress said sealant against said cascading channel.

5. The apparatus according to claim 4, wherein said cascading rib has a contour configured to match said cascading channel formed such that said sealant forms a seal between said one or more first ramp features and said one or more second ramp features.

6. The apparatus according to claim 5, wherein said cascading channel has a concave profile and said cascading rib has a convex profile that maximizes sealing surface area when said sealant is compressed between said one or more first ramp features and said one or more second ramp features.

7. The apparatus according to claim 5, wherein the cascading rib is narrower than the cascading channel.

8. The apparatus according to claim 1, wherein said one or more first ramp features are connected by one or more first plateau features and said one or more second ramp features are connected by one or more second plateau features.

9. The apparatus according to claim 8, wherein:

said one or more first ramp features and said one or more first plateau features form a winding channel into which said sealant is dispensed; and said one or more second ramp features and said one or more second plateau features form a winding rib that matches said winding channel such that said sealant forms a seal between said one or more first ramp features, said one or more first plateau features, said one or more second ramp features, and said one or more second plateau features.

10. The apparatus according to claim 1, wherein said one or more first ramp features include three descending ramp features arranged in a zig-zag pattern, alternating between extending toward and away from the back wall.

11. The apparatus according to claim 1, wherein each of said two side walls each further include a first plateau that extends parallel to and spaced apart from the top wall, wherein at least one ramp feature of said one or more first ramp features extends between said top wall and said first plateau, and wherein at least one second ramp feature of said one or more second ramp features extends from said first plateau and away from said top wall.

12. The apparatus according to claim 11, wherein each of said two side walls each further include a second plateau that extends parallel to and spaced apart from the top wall, wherein said at least one second ramp feature extends between said first plateau and said second plateau.

13. A method of assembling an electronic control unit comprising:

depositing a sealant material on one or more first ramp features of an upper housing, wherein said upper housing comprises three sides extending perpendicularly from a fourth side, wherein said three sides include a back wall and two side walls extending generally parallel to and spaced apart from one another and generally perpendicularly to the back wall, said four sides of said upper housing define a rectilinear volume and a connector opening, and said two side walls each define said one or more first ramp features configured to hold said sealant material; and assembling a connector and printed circuit board subassembly into said upper housing using a vertical motion, wherein (a) said connector and printed circuit board subassembly comprises a connector assembly holding a plurality of terminal pins and attached to a printed circuit board substrate, (b) said connector assembly extends perpendicularly from said printed circuit board substrate, (c) each of said plurality of terminal pins comprises a right angle bend, (d) a first end of each of said plurality of terminal pins is inserted into said printed circuit board substrate, (e) a second end of each of said plurality of terminal pins extend through said connector assembly, (f) said connector assembly comprises one or more second ramp features configured to mate with said one or more first ramp features of said upper housing, and (g) said upper housing is configured to (i) allow assembling of said connector and printed circuit board subassembly into said upper housing using said vertical motion and (ii) interlock with said connector assembly to hold said printed circuit board substrate with said connector assembly and said plurality of terminal pins in place within said housing, wherein the upper housing further includes a top wall, wherein the back wall and the two side walls each extend from and are generally perpendicular to the top wall, and wherein said one or more first ramp features includes a first descending ramp feature extending at an angle from the top wall, toward the back wall, and in a plane with one of the two side walls, and wherein said one or more first ramp features further includes a second descending ramp feature extending at an angle away from the top wall, away from the back wall, and in the plane with the one of the two side walls.

14. The method according to claim 13, wherein said one or more first ramp features and said one or more second ramp features have a slope of approximately forty-five degrees.

15. The method according to claim 14, wherein said sealant has a viscosity that minimizes flowing at a slope of said one or more first ramp features.

16. The method according to claim 13, wherein said one or more first ramp features form a cascading channel into which said sealant is dispensed and said one or more second ramp features form a cascading rib configured to compress said sealant.

17. The method according to claim 16, wherein said one or more second ramp features comprise a convex profile configured to match with a concave profile of said one or more first ramp features such that a maximized sealing area is formed between said one or more first ramp features and said one or more second ramp features.

* * * * *